(12) United States Patent
Wallner et al.

(10) Patent No.: US 11,056,591 B2
(45) Date of Patent: Jul. 6, 2021

(54) EPITAXIAL STRUCTURES OF SEMICONDUCTOR DEVICES THAT ARE INDEPENDENT OF LOCAL PATTERN DENSITY

(71) Applicant: GLOBALFOUNDRIES U.S. INC., Santa Clara, CA (US)

(72) Inventors: Jin Wallner, Albany, NY (US); Heng Yang, Rexford, NY (US); Judson Robert Holt, Ballston Lake, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 0 days.

(21) Appl. No.: 16/382,184

(22) Filed: Apr. 11, 2019

(65) Prior Publication Data

US 2020/0328306 A1    Oct. 15, 2020

(51) Int. Cl.
*H01L 21/8234* (2006.01)
*H01L 29/78* (2006.01)
*H01L 29/10* (2006.01)
*H01L 27/088* (2006.01)
*H01L 21/84* (2006.01)

(52) U.S. Cl.
CPC .. *H01L 29/7848* (2013.01); *H01L 21/823431* (2013.01); *H01L 21/845* (2013.01); *H01L 27/0886* (2013.01); *H01L 29/1087* (2013.01); *H01L 29/785* (2013.01)

(58) Field of Classification Search
CPC ......... H01L 29/7848; H01L 21/823431; H01L 29/1087; H01L 21/845; H01L 27/0886; H01L 29/785
See application file for complete search history.

(56) References Cited

U.S. PATENT DOCUMENTS

| | | | |
|---|---|---|---|
| 2013/0292777 A1* | 11/2013 | Liaw | G11C 11/419 257/369 |
| 2015/0255543 A1 | 9/2015 | Cheng et al. | |
| 2016/0284695 A1* | 9/2016 | Liaw | H01L 27/088 |
| 2019/0157148 A1* | 5/2019 | Hsieh | H01L 23/53261 |

* cited by examiner

*Primary Examiner* — Selim U Ahmed
(74) *Attorney, Agent, or Firm* — David Cain

(57) ABSTRACT

A method of forming a semiconductor device is provided, which includes providing gate structures over an active region and forming a hard mask segment on the active region positioned between a first gate structure and a second gate structure. Cavities are formed in the active region using the gate structures and the hard mask segment as masking features, wherein each cavity has a width substantially equal to a minimum gate-to-gate spacing of the semiconductor device. Epitaxial material is grown in the cavities to form substantially uniform epitaxial structures in the active region.

20 Claims, 6 Drawing Sheets

EPITAXIAL STRUCTURES OF SEMICONDUCTOR DEVICES THAT ARE INDEPENDENT OF LOCAL PATTERN DENSITY

FIELD OF THE INVENTION

The disclosed subject matter relates generally to semiconductor devices, and more particularly to a method of growing substantially uniform epitaxial structures for field effect transistor (FET) devices that are independent of the local pattern density of the semiconductor devices and the resulting semiconductor devices.

BACKGROUND

Technological advances in semiconductor integrated circuit (IC) industry have brought tremendous device miniaturization with performance improvements. One of the contributions to IC performance improvement has been modulating channel lengths of field effect transistor (FET) devices to alter associated resistance of the channel regions. More specifically, by reducing the channel length of the FET device, the associated resistance of the channel regions is consequently reduced, and this may allow an increase in current flow between source/drain regions of the FET device when a sufficient voltage is applied to the FET device.

Stress may be introduced to the channel region of the FET device to improve carrier mobility. Generally, it is desirable to induce tensile stress in the channel region of an N-type metal-oxide-semiconductor (NMOS) FET device and compressive stress in the channel region of a P-type metal-oxide-semiconductor (PMOS) FET device. A commonly used method for applying stress to a channel region of the FET device is growing epitaxial structures in the source/drain regions adjacent to the channel region, which typically includes forming cavities in the substrate along gate stacks of FET device and growing epitaxial structures in the cavities.

One of the challenges of growing epitaxial structures is managing the pattern-loading effects, which occur due to a difference in local pattern density. The pattern-loading effects pertain to a phenomenon occurring during the simultaneous epitaxial growth in a region of a higher pattern density and a region of a lower pattern density. Due to a difference in growth rates of the epitaxial layer in these regions, the amount of epitaxial material grown can differ depending on the local pattern density, and this causes non-uniformity in thicknesses and composition of resulting epitaxial structures. For example, a higher pattern density area with smaller areas for epitaxial growth may have a higher growth rate than that of a lower pattern density area. Furthermore, the composition of the epitaxial structures at high pattern density areas may be different from those epitaxial structures at low pattern density areas. The non-uniformity of epitaxial structures in terms of layer thicknesses and composition may adversely affect the FET device performance.

As described above, there is a need to present a method of growing substantially uniform epitaxial structures that are independent of the local pattern density of the semiconductor devices.

SUMMARY

To achieve the foregoing and other aspects of the present disclosure, a method of growing substantially uniform epitaxial structures that are independent of the local pattern density of the semiconductor devices and the resulting semiconductor devices are presented.

According to an embodiment of the disclosure, a method of forming a semiconductor device is provided, which includes providing gate structures over an active region and forming a hard mask segment on the active region positioned between a first gate structure and a second gate structure. Cavities are formed in the active region using the gate structures and the hard mask segment as masking features, wherein each cavity has a width substantially equal to a minimum gate-to-gate spacing of the semiconductor device. Epitaxial material is grown in the cavities to form substantially uniform epitaxial structures in the active region.

According to another embodiment of the disclosure, a method of forming a semiconductor device is provided, which includes providing a first gate structure and a second gate structure over an active region and forming a hard mask layer over the first gate structure, the second gate structure and the active region. Portions of the hard mask layer are removed to form a hard mask segment, exposing a first portion of the active region between the first gate structure and the hard mask segment and a second portion of the active region between the hard mask segment and the second gate structure. Cavities are formed in the exposed first and second portions of the active region, wherein each cavity has a width substantially equal to a minimum gate-to-gate spacing of the semiconductor device. Epitaxial material is grown in the cavities to form substantially uniform epitaxial structures in the active region.

According to yet another embodiment of the disclosure, a semiconductor device is provided, which includes an array of active regions, gate structures and substantially uniform epitaxial structures. The gate structures of the array include a first gate structure and a second gate structure over an active region. The first gate structure and the second gate structure have at least two substantially uniform epitaxial structures therebetween. The substantially uniform epitaxial structures have a width substantially equal to a minimum gate-to-gate spacing between the gate structures of the array.

BRIEF DESCRIPTION OF THE DRAWINGS

The embodiments of the present disclosure will be better understood from a reading of the following detailed description, taken in conjunction with the accompanying drawings.

Figure 1:
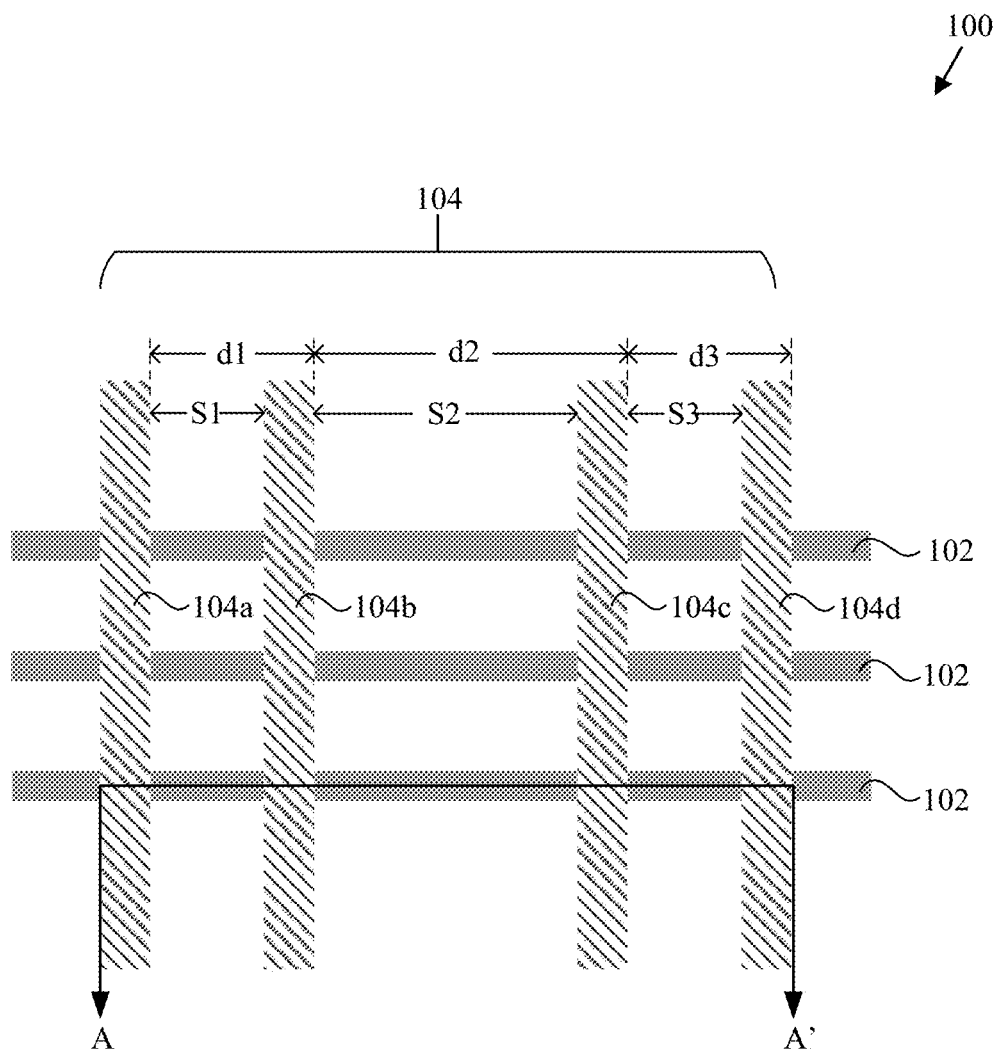
FIG. 1 is a top view of a FinFET device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

Various embodiments of the disclosure are described below. The embodiments disclosed herein are exemplary and not intended to be exhaustive or limiting to the disclosure.

The disclosure relates to a method of growing substantially uniform epitaxial structures for field effect transistor (FET) devices that are independent of the local pattern density of the semiconductor devices. The FET devices may be complementary metal-oxide-semiconductor (CMOS) devices including P-type metal-oxide-semiconductor (PMOS) FET devices and/or N-type metal-oxide-semiconductor (NMOS) FET devices.

In particular, while the disclosure discusses various embodiments of FinFET devices, it should be noted that the disclosure is not limited to any particular type of semiconductor device. The method disclosed herein may be applied to any type of transistor devices, such as tri-gate FET devices, FinFET devices or planar-type MOSFET devices.

The various embodiments of the FinFET devices in this present disclosure may be fabricated with gate first or gate last FinFET fabrication process techniques. In a gate first process, conductive layers over first structure areas (e.g. NMOS areas, etc.) and second structure areas (e.g. PMOS areas, etc.) are formed and patterned to form gate structures followed by conventional CMOS processing, including formation of source and drain regions, formation of spacers and deposition of inter-level dielectric (ILD) material. In a gate last process, dummy gate structures are formed followed by conventional CMOS processing including formation of the source and drain regions, formation of spacers and deposition of ILD material. Thereafter, the dummy gate structures are removed followed by conventional formation of replacement gate structures.

Aspects of the disclosure are now described in detail with accompanying drawings. It is noted that like and corresponding elements are referred to by the use of the same reference numerals. However, it is noted that specific elements may be denoted by a reference numeral and a subscript, for example 104a, 104b, etc. When those elements are referred to generically, merely the reference numerals are used, for example 104, 204, etc.

FIG. 1 is a simplified top view of a FinFET device 100, according to an embodiment of the disclosure. The FinFET device 100 includes an array of fins 102 and gate structures 104. The gate structures 104 transverse the fins 102. Those skilled in the art would recognize, after a complete reading of the disclosure, the number and placement locations of the fins 102 and the gate structures 104 may vary according to the specific design of each FinFET device.

As illustrated in FIG. 1, a first gate structure 104a and a second gate structure 104b are separated by a pitch d1. The second gate structure 104b and a third gate structure 104c are separated by a pitch d2. The third gate structure 104c and a fourth gate structure 104d are separated by a pitch d3. The pitch d2 is wider than the pitch d1 and the pitch d3. The pitch d1 and the pitch d3 may or may not be equal. The local density between the second and third gate structures (104b and 104c, respectively) is lower than surrounding areas, due to the wider pitch d2.

The term "pitch" as used herein defines a distance from a left edge of a structure to a left edge of an adjacent identical structure. The minimum pitch of gate structures in a semiconductor device is termed "contacted poly pitch" (CPP), with a corresponding minimum gate-to-gate spacing. The term "spacing" as used herein defines a distance between two adjacent structures. In this embodiment, the pitch d1 has a width that is equal to the CPP of the FinFET device 100, with a corresponding minimum gate-to-gate spacing S1. In another embodiment of the disclosure, the pitch d2 has a width wider than an integer multiple of CPP, with a corresponding gate-to-gate spacing S2. For example, the pitch d2 may have a width wider than 2×, 3× or 4× the CPP of the FinFET device 100, i.e., 2×CPP, 3×CPP or 4×CPP, respectively. In yet another embodiment of the disclosure, the pitch d3 may be equal to or wider than the pitch d1, with a corresponding gate-to-gate spacing S3.

FIGS. 2A-2F are cross-sectional views of a FinFET device 200 (taken along a line A-A' as indicated in FIG. 1), illustrating a method of growing substantially uniform epitaxial structures for a FinFET device that is independent of the local pattern density, according to embodiments of the disclosure.

Figure 2A:
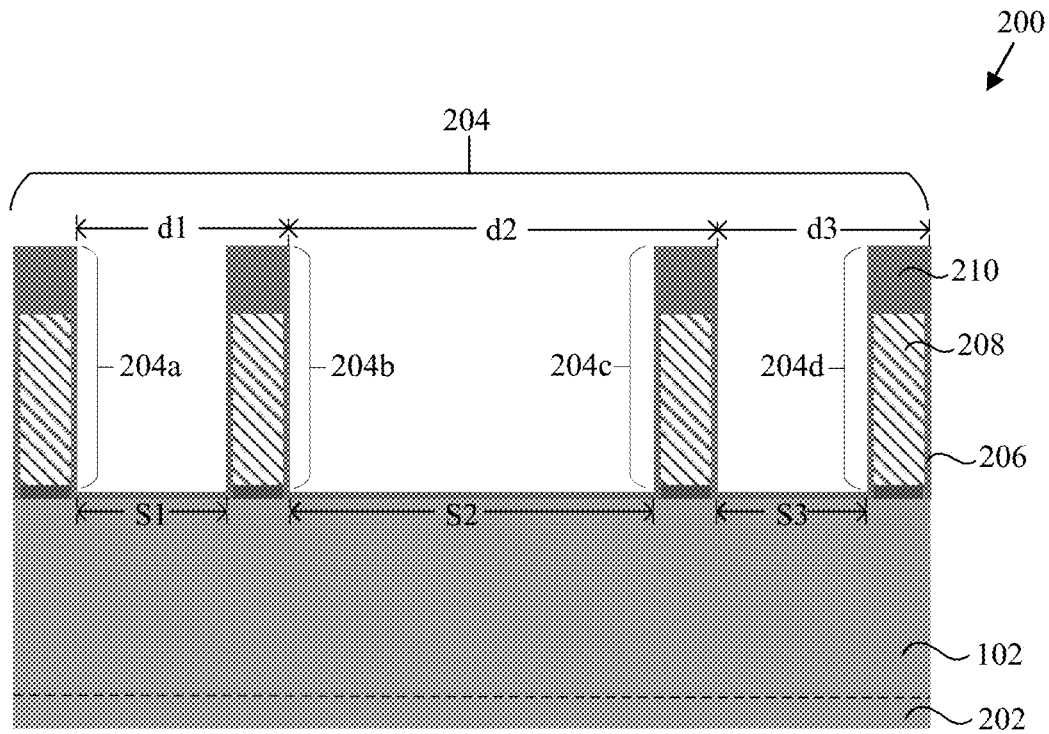
FIGS. 2A-2F are cross-sectional views of a FinFET device (taken along lines A-A' and B-B' as indicated in FIG. 1), depicting a method of growing substantially uniform epitaxial structures that are independent of the local pattern density, according to an embodiment of the disclosure.

FIG. 2A is a cross-sectional view of the FinFET device 200, including a semiconductor substrate 202 and the fin 102 extending upwards from the substrate 202. Gate stacks 204 are disposed over the fin 102. The gate stacks 204 transverse the fin 102, separating a source region from a drain region and defining a channel region. Gate spacers 206 are disposed over the gate stacks 204 and the fin 102. The fins 102 generally define active regions for forming the source and drain regions for FinFET devices.

While the fins 102 define active regions for the FinFET device 200 in the present disclosure, it should be noted that the fin 102 is used only as a non-limiting example of an active region. Other active regions (e.g., a doped layer on a top surface of a bulk semiconductor substrate or a semiconductor-on-insulator layer, etc.) may be used for different types of transistor devices As illustrated in FIG. 2A, there are four gate stacks (a first gate stack 204a, a second gate stack 204b, a third gate stack 204c and a fourth gate stack 204d, respectively), each gate stack includes a dummy gate structure 208, a gate cap 210 and gate spacers 206 fabricated by a gate last FinFET fabrication process. The dummy gate structure 208 may be formed of a sacrificial material (e.g., amorphous silicon). The gate spacers 206 may be formed of a low-k dielectric material, i.e., a dielectric material having a low dielectric constant, preferably silicon nitride. In an alternative embodiment of the disclosure, the gate stacks 204 include a metal gate structure fabricated by a gate first FinFET fabrication process.

The first gate stack 204a and the second gate stack 204b are separated by a gate-to-gate spacing S1. The second gate stack 204b and the third gate stack 204c are separated by a gate-to-gate spacing S2. The third gate stack 204c and the fourth gate stack 204d are separated by a gate-to-gate spacing S3. The gate-to-gate spacing S2 is wider than the gate-to-gate spacing S1 and the gate-to-gate spacing S3. The gate-to-gate spacing S1 and the gate-to-gate spacing S3 may or may not be equal. In this embodiment, the gate-to-gate spacing S1 is equal to the minimum gate-to-gate spacing of the FinFET device 200.

The semiconductor substrate 202 may include of any appropriate semiconductor material, such as silicon, silicon germanium, silicon carbon, other II-VI or III-V semiconductor compounds and the like. In one embodiment of the disclosure, the semiconductor material of the substrate 202 is preferably silicon.

Figure 2B:
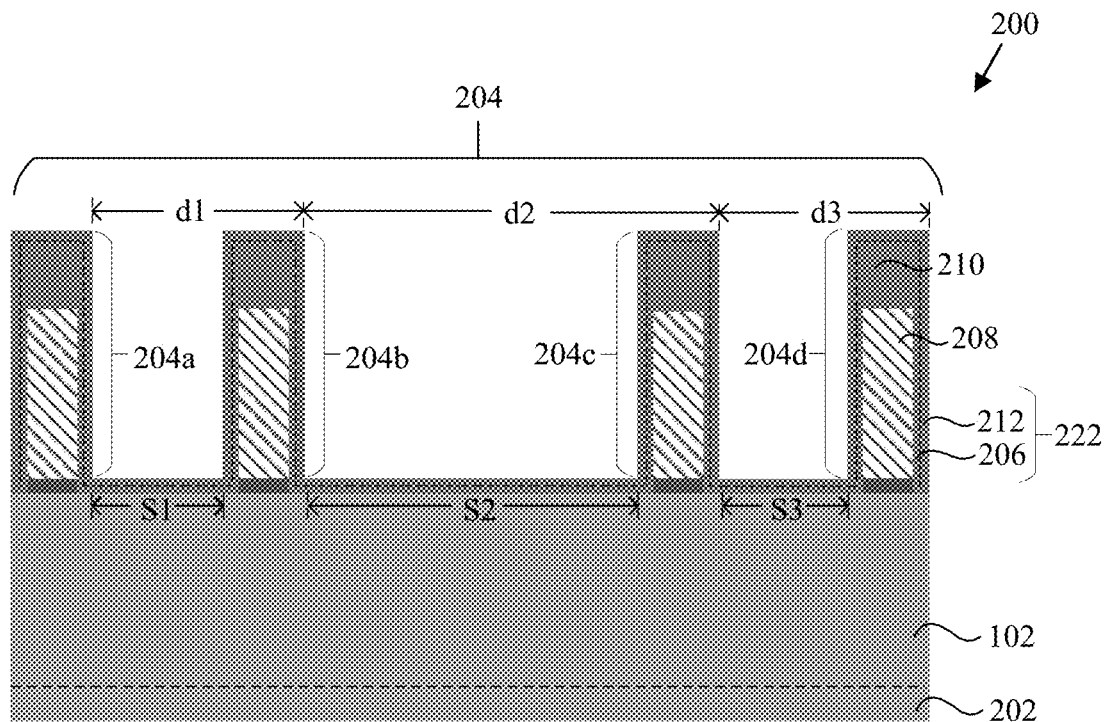

FIG. 2B illustrates the FinFET device 200 after deposition of a dielectric layer 212, according to an embodiment of the disclosure. The dielectric layer 212 is deposited over the gate spacers 206, as demarcated by a dotted line. The gate spacers 206 and the dielectric layer 212 in combination form a hard mask layer 222 over the FinFET device 200. In this embodiment of the disclosure, the dielectric layer 212 is preferably formed of the same material as the gate spacers 206. In another embodiment of the disclosure, the dielectric layer 212 is preferably silicon nitride. In yet another embodiment of the disclosure, the dielectric layer 212 has a thickness ranging from 2 to 10 nm.

Figure 2C:
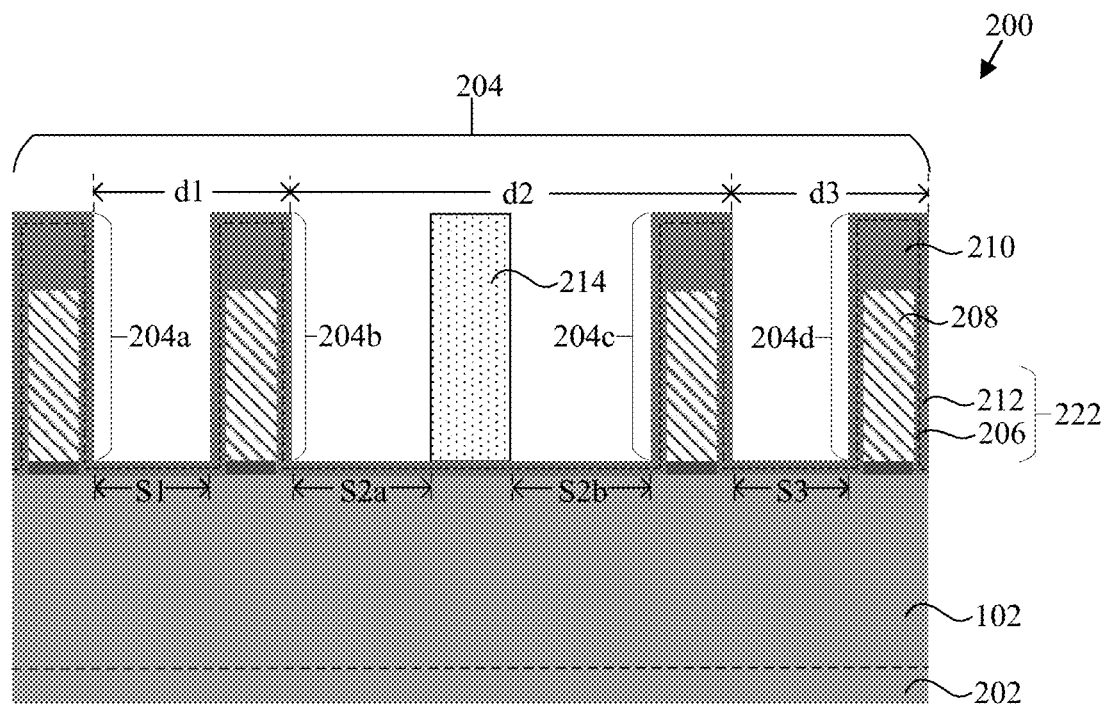

FIG. 2C illustrates the FinFET device 200 after selectively covering a portion of the hard mask layer 222, according to an embodiment of the disclosure. A patterning layer 214 is deposited using a suitable deposition process. Using a suitable lithographic process, portions of the patterning layer are removed, exposing portions of the hard mask layer 222. A portion of the patterning layer 214 is left selectively covering a portion of the hard mask layer 222 between the second gate stack 204b and the third gate stack 204c.

In this embodiment of the disclosure, the second gate stack 204b and the remaining portion of the patterning layer 214, as illustrated in FIG. 2C, is separated by a gate-to-patterning layer spacing S2a, and the patterning layer 214 and the third gate stack 204c is separated by a patterning layer-to-gate spacing S2b. The gate-to-patterning layer spacing S2a and the patterning layer-to-gate spacing S2b have a width substantially equal to the minimum gate-to-gate spacing of the FinFET device 200.

It will be appreciated by those skilled in the art that the width of the patterning layer 214 covering the hard mask layer 222 may be adjusted to a pre-determined width to form openings in the patterning layer 214 having a width substantially equal to the minimum gate-to-gate spacing of the FinFET device. Although not shown, more than two openings in the patterning layer 214 may be formed between the second gate stack 204b and the third gate stack 204c for the FinFET device 200 if the pitch d2 has a wider width of at least than 2×CPP.

Figure 2D:
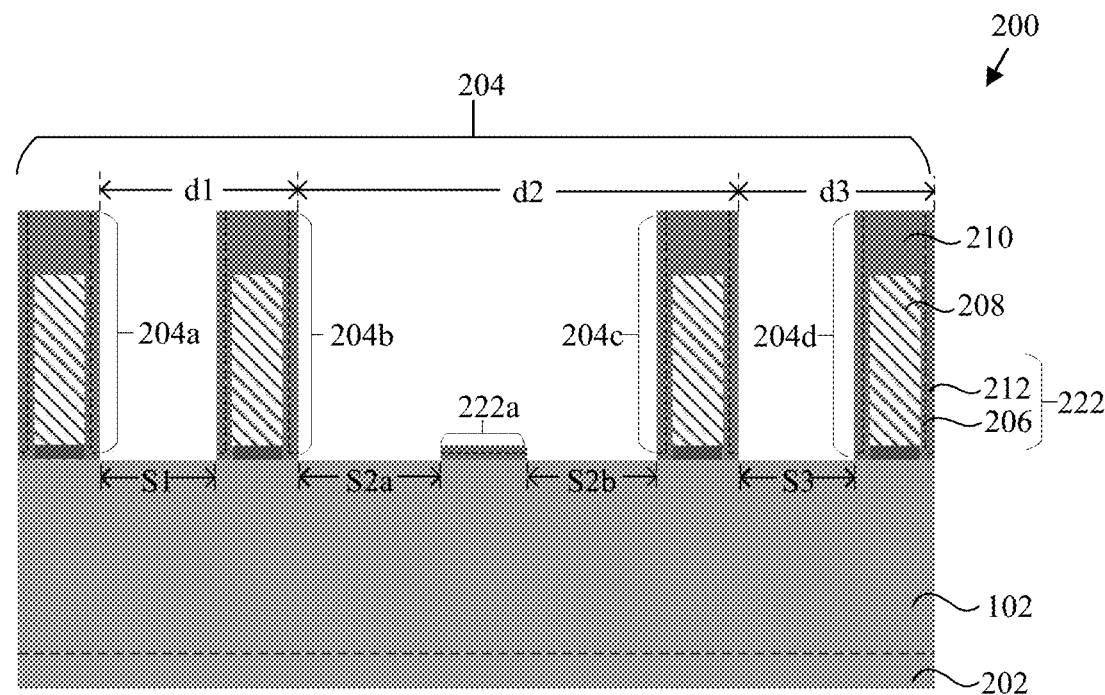

FIG. 2D illustrates the FinFET device 200 after selectively removing the exposed portions of hard mask layer 222, according to an embodiment of the disclosure. A suitable material removing process is employed and a hard mask segment 222a, which was covered by the patterning layer 214 in FIG. 2C, is left on the fin 102 between the second gate stack 204b and the third gate stack 204c. The hard mask segment 222a has a width substantially equal to the width of the patterning layer 214. The hard mask layer 222 on sidewalls of the gate stacks may or may not be removed by the material removing process. Portions of the fins 102 are exposed, each portion having a width substantially equals to the minimum gate-to-gate spacing of the FinFET device 200. The patterning layer 214 may be removed after the material removing process. In one embodiment of the disclosure, the suitable material removing process is a dry etch process.

Figure 2E:
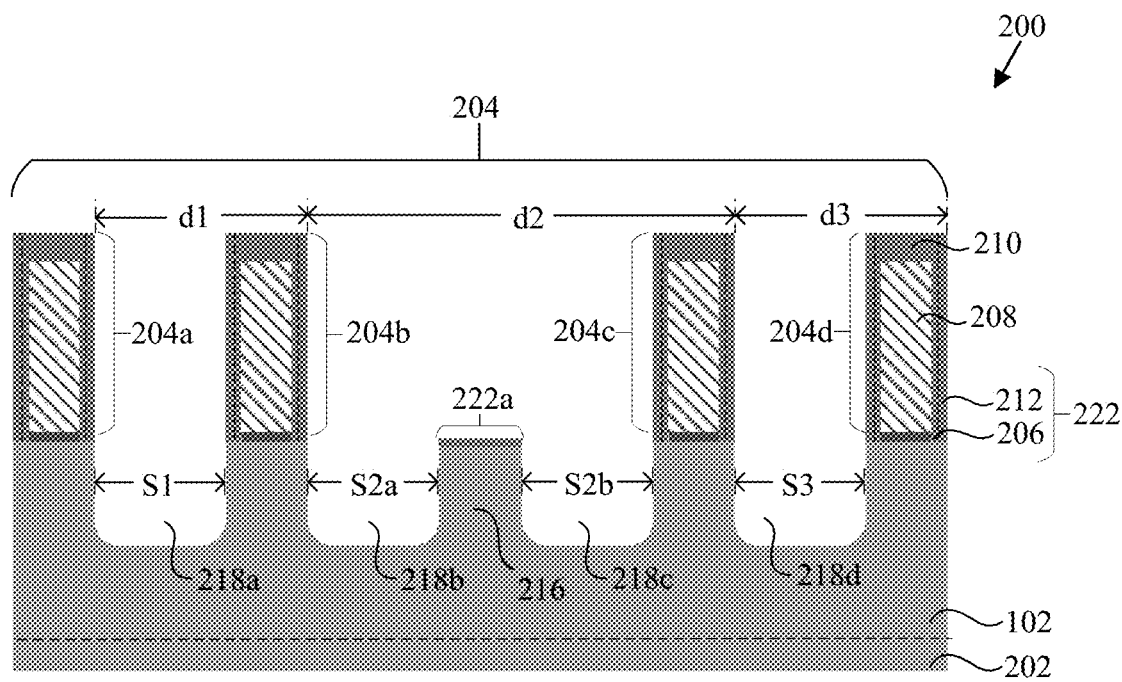

FIG. 2E illustrates the FinFET device 200 after forming fin cavities 218, according to an embodiment of the disclosure. Using the first, second, third and fourth gate stacks (204a, 204b, 204c and 204d, respectively) and the hard mask segment 222a as masking features, the fin cavities 218 are formed by a suitable material removing process. Fin cavity formation has known techniques in the art. The formed fin cavities 218 are substantially uniform in size and have a width substantially equal to the minimum gate-to-gate spacing of the FinFET device 200. The fin cavities 218a and 218b are separated by the second gate stack 204b, the fin cavities 218b and 218c are separated by a fin segment 216, and the fin cavities 218c and 218d are separated by the third gate stack 204c. The fin segment 216 has a width substantially equal to the width of the hard mask segment 222a. Portions of the hard mask layer 222, including portions of the hard mask segment 222a, and/or the gate spacers 206 may be removed during the material removing process. In one embodiment of the disclosure, the suitable material removing process may be a reactive ion etch (ME) process.

Alternatively, an implantation process may be performed before the suitable material removing process, according to another embodiment of the disclosure. The exposed fin portions 102 are implanted with dopants, forming implanted fin regions (not shown) having dissimilar material properties than the fin 102. The implanted fin regions may be subsequently removed with the suitable material removing process, such as a wet etch process, a dry etch process or a combination of both.

More specifically, a first fin cavity 218a is formed between the first gate stack 204a and the second gate stack 204b, a second fin cavity 218b is formed between the second gate stack 204b and the fin segment 216, a third fin cavity 218c is formed between the fin segment 216 and the third gate stack 204c, and a fourth fin cavity 218d is formed between the third gate stack 204c and the fourth gate stack 204d. The fin cavities 218 are substantially uniform in size and substantially equal to the minimum gate-to-gate spacing of the FinFET device 200. The second and third fin cavities (218b and 218c, respectively) increase the local pattern density around the second and third gate stacks (204b and 204c, respectively) by providing additional surface planes for epitaxial material to grow.

Figure 2F:
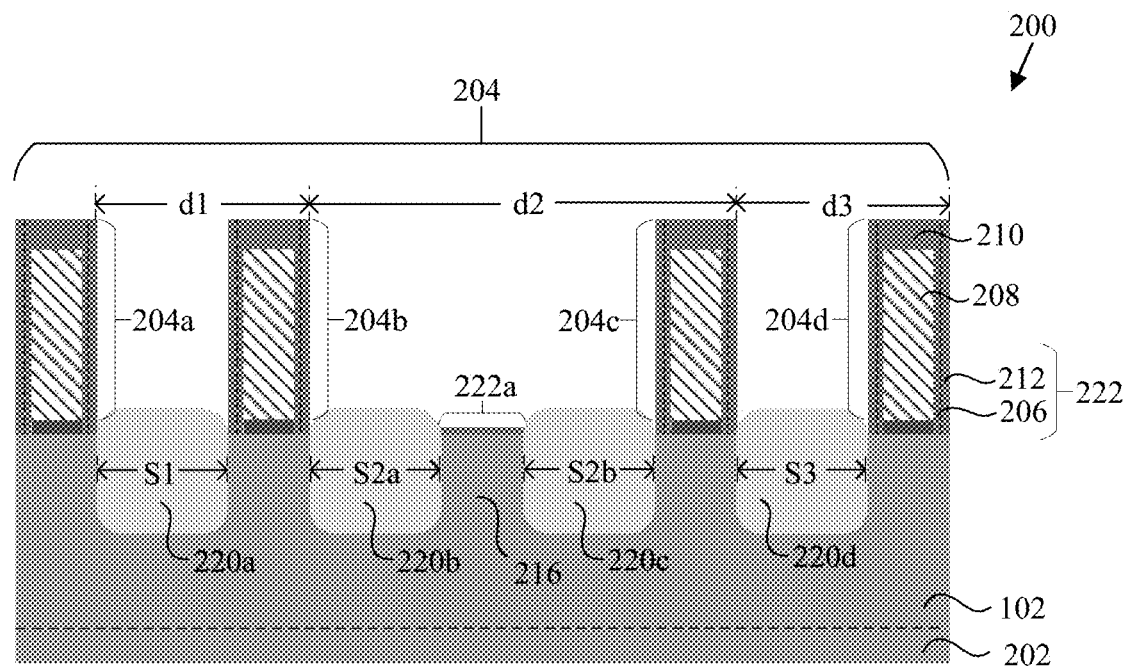

FIG. 2F illustrates the FinFET device 200 after forming epitaxial structures 220 in the fin cavities 218, according to an embodiment of the disclosure. The FinFET device 200 may be subjected to a cleaning process prior to performing an epitaxy process. The cleaning process may be performed using a variety of etchants or cleaning agents, such as a dilute hydrofluoric acid. The cleaning process may remove any undesirable oxide material formed as a result of natural oxidation of exposed surfaces in the fin cavities 218.

The epitaxial structures 220 may be formed by growing an epitaxial material using a suitable epitaxy process, such as vapor-phase epitaxy process, liquid-phase epitaxy process or solid-phase epitaxy process. The epitaxial structures 220 may be grown selectively, i.e., the epitaxial growth only occurs over certain surfaces, such as over semiconductor surfaces in the fin cavities 218, while other surfaces remain substantially free of epitaxial material. Selective epitaxial growth has known techniques in the art.

Since the fin cavities 218 are substantially uniform in size, the pattern-loading effect is significantly reduced and a similar amount of epitaxial material is grown in the fin cavities 218. The formed epitaxial structures 220 are expected to have similar geometric properties and are independent of associated gate pitch. Although FIG. 2E illustrates the hard mask segment 222a between the epitaxial structures 220b and 220c, the hard mask segment 222a may be removed after the epitaxy process, according to an alternative embodiment of the disclosure.

The material used to grow the epitaxial structures 220 may include silicon, silicon phosphorous, silicon phosphorous carbide, germanium, gallium arsenide, gallium nitride, aluminum gallium indium phosphide, and/or other suitable combinations. In one embodiment of the disclosure where an NMOS FinFET device is desired, the epitaxial structures 220 may include epitaxially-grown silicon. In another embodiment of the disclosure, where a PMOS FinFET device is desired, the epitaxial structures 220 may include epitaxially-grown silicon germanium.

The epitaxial structures 220 may be in-situ doped or undoped. In one embodiment of the disclosure, the epitaxial structures 220 may be doped with N-type donors during the epitaxy process to form NMOS source/drain regions. The N-type donors may include phosphorus, arsenic, antimony, and/or other suitable dopants. In another embodiment of the disclosure, the epitaxial structures 220 may be doped with P-type acceptors during the epitaxy process to form PMOS source/drain regions. The P-type acceptors may include boron, aluminum, gallium, indium, and/or other suitable dopants. One or more annealing processes may be performed to activate the source/drain regions. The annealing processes may include rapid thermal annealing (RTA) and/or laser annealing processes.

Additional process steps may be performed before, during or after forming the epitaxial structures 220. For example, when forming epitaxial structures in a PMOS device, one or more layers, such as patterning layers and dielectric layers may be formed on an NMOS device as protection layers by suitable deposition processes.

Figure 3A:
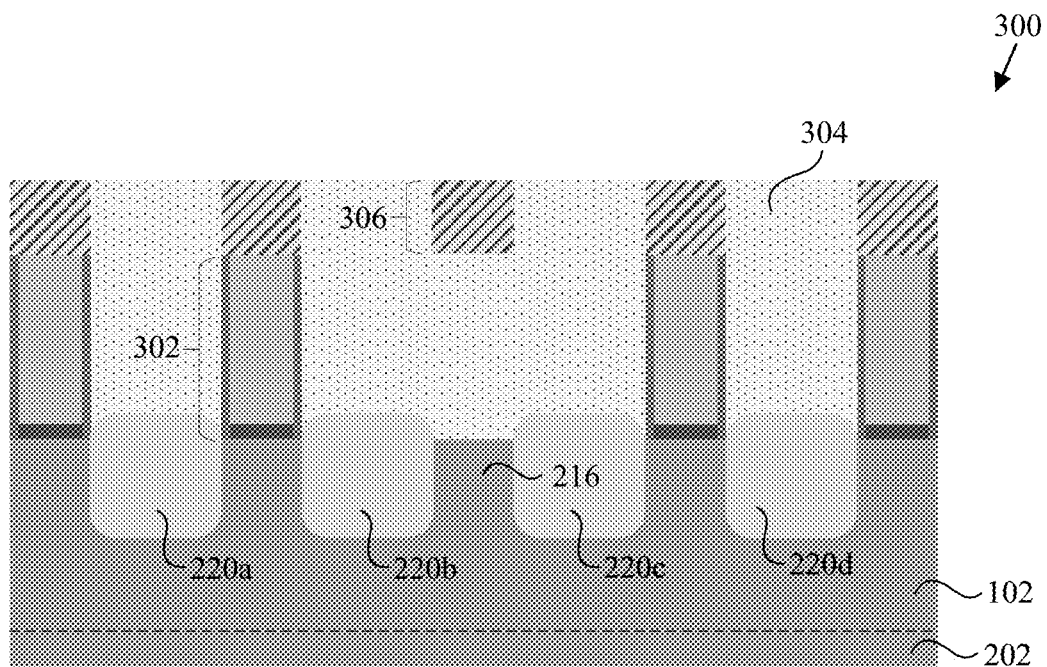
FIGS. 3A-3B are cross-sectional views of a FinFET device, according to embodiments of the disclosure.
Figure 3B:
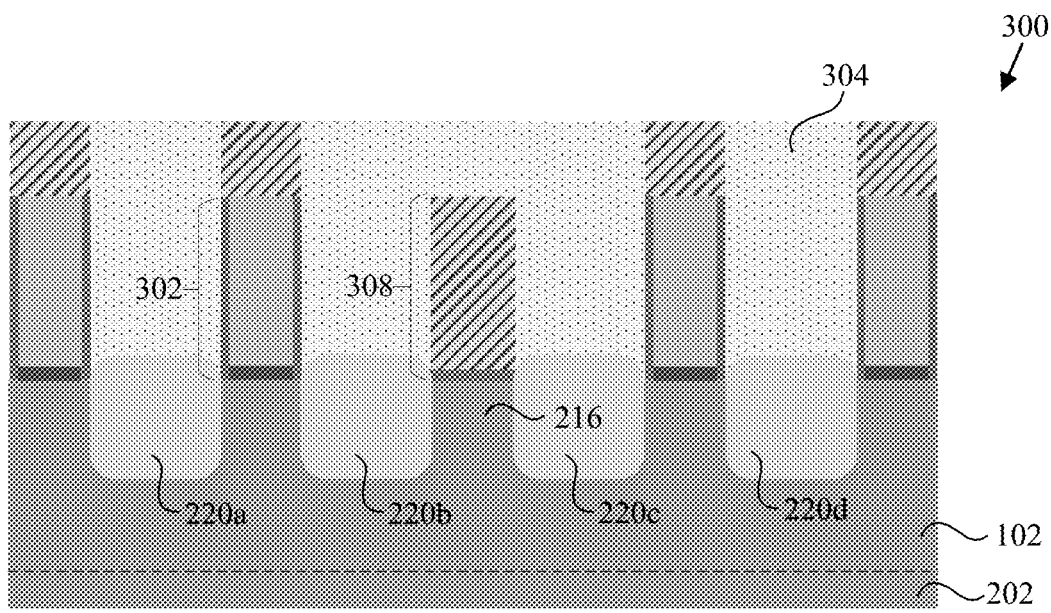

FIGS. 3A and 3B illustrate a FinFET device 300 after additional process steps have been performed to form replacement gate structures 302, according to embodiments of the disclosure. The processes may include one or more deposition process operations to form a gate insulation layer (e.g., silicon dioxide, hafnium oxide, or a high-k dielectric material, etc.) and one or more conductive layers (e.g., barrier layers, seed layers, work function material layers or fill layers, etc.) that will be part of the gate electrode of the replacement gate structure 302 (layers are not separately shown).

As illustrated in FIG. 3A, the substantially uniform epitaxial structures 220b and 220c may be connected by an electrically conductive material adjacent to the replacement gate structures 302, according to one embodiment of the disclosure. The electrically conductive material forms source/drain contacts 304 of the FinFET device 300. An isolation structure 306 may be formed at a middle-of-line region of the FinFET device 300 to isolate the source/drain contacts 304 of the substantially uniform epitaxial structures 220b and 220c respectively. The isolation structure 306 may include one or more dielectric layers.

As illustrated in FIG. 3B, the substantially uniform epitaxial structures 220b and 220c may also be connected by source/drain contacts 304 at a middle-of-line region of the FinFET device 300, according to another embodiment of the disclosure. The source/drain contacts 304 of the substantially uniform epitaxial structures 220b and 220c may be isolated by forming an isolation structure 308 including one or more dielectric layers between their respective source/drain contacts 304, adjacent to the replacement gate structures 302.

Figure 4A:
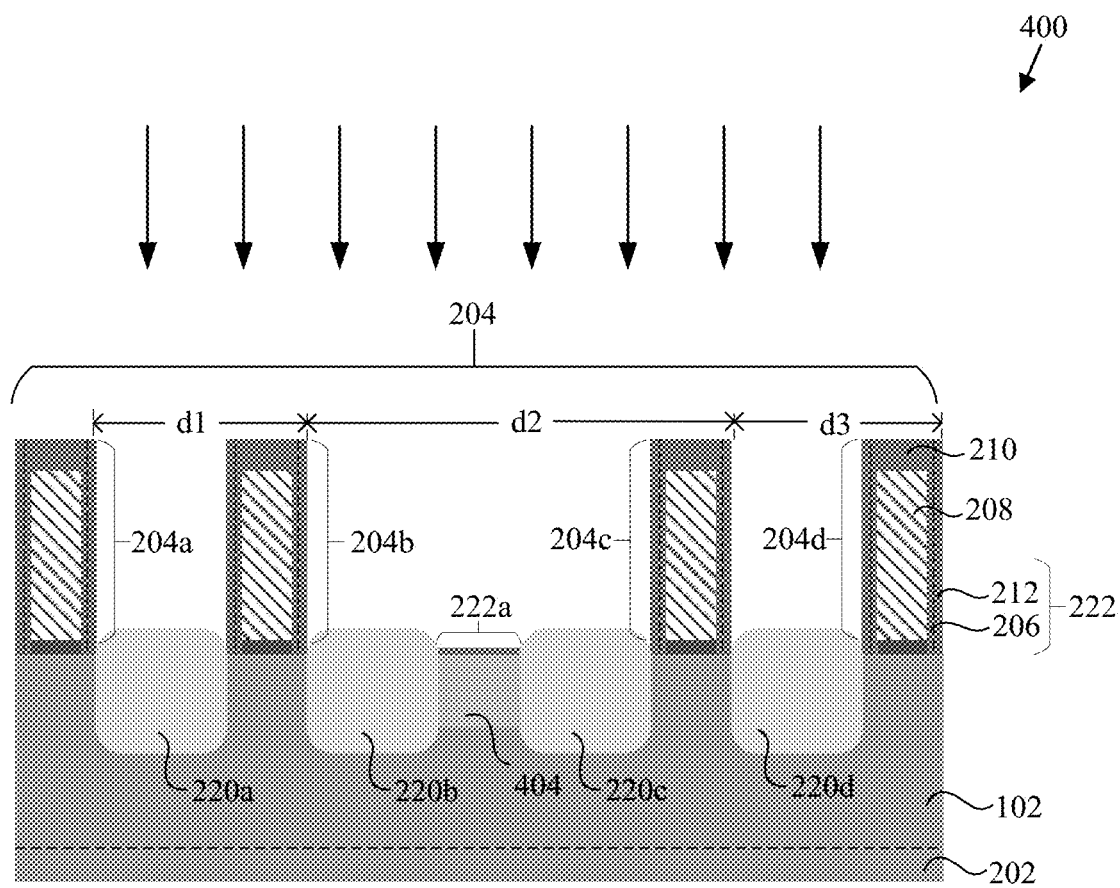
FIGS. 4A-4B are cross-sectional views of a FinFET device, according to an embodiment of the disclosure.
Figure 4B:
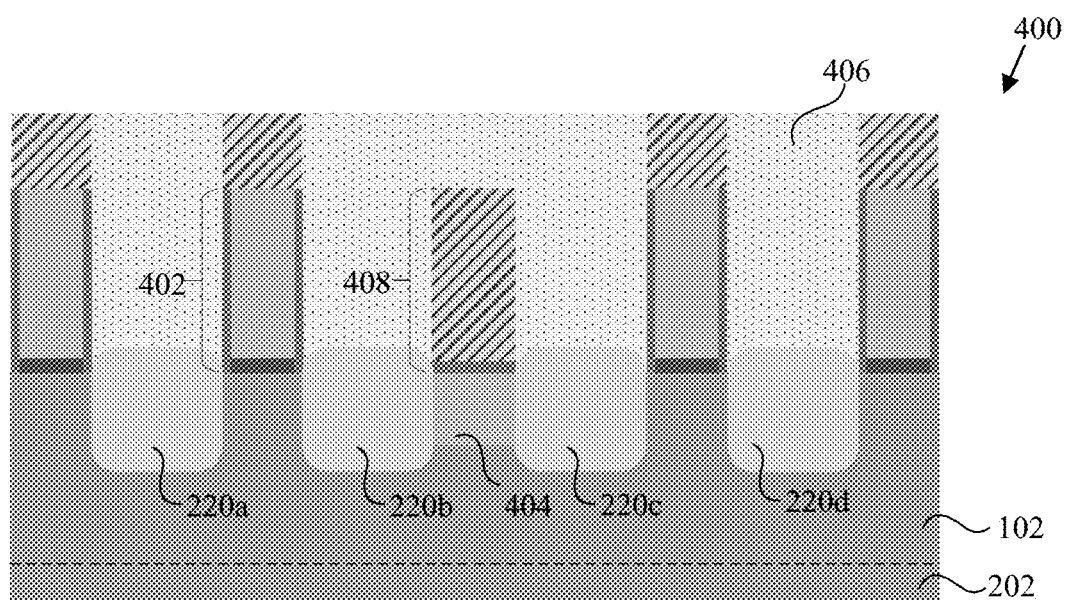

FIGS. 4A and 4B illustrate a FinFET device 400 after additional process steps have been performed to form replacement gate structures 402, according to an alternative embodiment of the disclosure. The substantially uniform epitaxy structures 220b and 220c may be connected by forming an implanted fin segment 404.

As illustrated in FIG. 4A, the implanted fin segment 404 may be formed by performing a suitable implantation process at the fin segment 216 (previously shown in the above figures) before a replacement metal gate process. Additional process steps are typically performed before the implantation process, such as forming one or more patterning layers and/or dielectric layers, as protection layers for regions that will not be implanted. The implantation process may use any suitable dopants.

As illustrated in FIG. 4B, source/drain contacts 406 may be formed on the substantially uniform epitaxial structures 220 after the implantation process. The source/drain contacts 406 may connect the substantially uniform epitaxial structures 220b and 220c at a middle-of-line region of the FinFET device 400. The source/drain contacts 406 for the substantially uniform epitaxial structures 220b and 220c may be isolated by forming an isolation structure 408, including one or more dielectric layers between their respective source/drain contacts 406. The substantially uniform epitaxial structures 220 may also be connected adjacent to the replacement gate structures 402 (not shown).

In the above detailed description, a method of growing substantially uniform epitaxial structures for field effect transistor (FET) devices that are independent of the local pattern density of the semiconductor devices is presented. Active regions of low local pattern densities (e.g., a large gate-to-gate active region) are divided into multiple smaller active regions having a width substantially equal to the minimum gate-to-gate spacing of the FET devices. The multiple smaller active regions are formed using hard mask segments formed by conventional lithographic and material removing processes. Cavities formed in the multiple smaller active regions will create additional surface planes and increase the local pattern density, enabling a substantially uniform growth of epitaxial structures in the cavities. The amount of epitaxial material grown is therefore independent of associated gate pitch of the semiconductor devices.

The multiple substantially uniform epitaxial structures formed in the large gate-to-gate active region may be connected by source/drain contacts adjacent to the gate structures, or above the gate structures in the middle-of-line region of the FinFET device. The multiple substantially uniform epitaxial structures formed in the large gate-to-gate active region may also be connected by an implantation process before forming electrically conductive connections with source/drain contacts.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A method of forming a semiconductor device comprising:
    providing active gate structures over an active region;
    forming a hard mask segment on the active region positioned between a first active gate structure and a second active gate structure, the second active gate structure being immediately adjacent to the first active gate structure;
    forming cavities in the active region between the first and second active gate structures using the active gate structures and the hard mask segment as masking features, wherein each cavity is substantially uniform in size and the cavities separated by an active region segment therebetween, the active region segment having a pre-determined width that defines the widths of the cavities; and
    growing epitaxial material in the cavities to form epitaxial structures that are substantially uniform in size in the active region.

2. The method of claim 1, wherein forming the hard mask segment further comprises:
    depositing a hard mask layer over the active gate structures and the active region;
    depositing a patterning layer over the hard mask layer;
    forming openings in the patterning layer to expose portions of the hard mask layer; and
    removing the exposed portions of the hard mask layer to form the hard mask segment.

3. The method of claim 1 wherein the hard mask segment is formed of silicon nitride.

4. The method of claim 1 further comprises depositing an electrically conductive material over the epitaxial structures, wherein the electrically conductive material forms source/drain contacts that connect the epitaxial structures of the semiconductor device.

5. The method of claim 1 wherein the cavities in the active region include a first cavity formed between the first active gate structure and the hard mask segment and a second cavity formed between the hard mask segment and the second active gate structure.

6. The method of claim 5 wherein the hard mask segment has a pre-determined width that defines the widths of the first and second cavities in the active region to be substantially equal to the minimum gate-to-gate spacing of the semiconductor device.

7. The method of claim 5 further comprising forming a doped region under the hard mask segment using an implantation process to electrically connect the epitaxial structures in the first and second cavities in the active region.

8. A method of forming a semiconductor device comprising:
    providing a first active gate structure and a second active gate structure over an active region, the second active gate structure being immediately adjacent to the first active gate structure;
    forming a hard mask layer over the first active gate structure, the second active gate structure and the active region;
    removing portions of the hard mask layer to form a hard mask segment and exposing a first portion of the active region between the first active gate structure and the hard mask segment and a second portion of the active region between the hard mask segment and the second active gate structure;
    forming cavities in the exposed first and second portions of the active region, wherein each cavity is substantially uniform in size and the cavities separated by an active region segment therebetween, the active region segment having a pre-determined width that defines the widths of the cavities; and
    growing epitaxial material in the cavities to form epitaxial structures that are substantially uniform in size in the active region.

9. The method of claim 8 wherein the hard mask segment is formed by a lithographic process to expose portions of the hard mask layer using a patterning layer and a dry etch process to remove the exposed portions of the hard mask layer to form the hard mask segment.

10. The method of claim 8 wherein the hard mask segment has a pre-determined width that defines the widths of the cavities in the active region.

11. The method of claim 8 wherein the cavities in the active region are formed using the first active gate structure, the second active gate structure and the hard mask segment as masking features.

12. The method of claim 11 wherein the cavities of the active region are formed by a reactive ion etch process.

13. The method of claim 8 wherein the epitaxial structures are connected by an electrically conductive material.

14. The method of claim 13 wherein the electrically conductive material forms source/drain contacts of the semiconductor device.

15. A semiconductor device comprising:
    a first active gate structure and a second active gate structure over an active region, the second active gate structure being immediately adjacent to the first active gate structure;
    at least two epitaxial structures therebetween the first and second active gate structures, wherein the two epitaxial structures are separated by an active region segment, the active region segment having a pre-determined width that defines the widths of the epitaxial structures; and
    the at least two epitaxial structures are substantially uniform in size.

16. The semiconductor device of claim 15, wherein the active region segment comprises dopants.

17. The semiconductor device of claim 15, further comprises a dielectric layer over the active region segment.

18. The semiconductor device of claim 15 wherein the at least two epitaxial structures are connected by an electrically conductive material.

19. The semiconductor device of claim 18 wherein the electrically conductive material forms source/drain contacts.

20. The semiconductor device of claim 15, wherein the at least two epitaxial structures have a width substantially equal to the minimum gate-to-gate spacing of the semiconductor device.

* * * * *